United States Patent [19]

Morita et al.

[11] Patent Number: 5,946,608
[45] Date of Patent: Aug. 31, 1999

[54] MIXER CIRCUIT

[75] Inventors: Kuniaki Morita; Masao Noro, both of Hamamatsu, Japan

[73] Assignee: Yamaha Corporation, Hamamatsu, Japan

[21] Appl. No.: 08/940,100

[22] Filed: Sep. 29, 1997

[30] Foreign Application Priority Data

Sep. 30, 1996 [JP] Japan ................................. 8-259021

[51] Int. Cl.$^6$ ........................................................ H04B 1/16
[52] U.S. Cl. .......................... 455/334; 330/282; 330/284
[58] Field of Search ................................ 455/334, 293, 455/296, 303, 232, 341, 246.1, 234.1, 283, 239.1, 240.1, 245.1, 248.1, 250.1; 341/560, 561; 330/282, 284; 375/345, 349

[56] References Cited

U.S. PATENT DOCUMENTS

| 5,233,309 | 8/1993 | Spitalny et al. | 330/284 |
| 5,408,199 | 4/1995 | Nagano et al. | 330/284 |
| 5,808,516 | 6/1996 | Barber | 330/282 |

Primary Examiner—Wellington Chin
Assistant Examiner—Simon Nguyen
Attorney, Agent, or Firm—Graham & James LLP

[57] ABSTRACT

A mixing circuit that mixes a plurality of input signals are provided. A plurality of input terminals receive the input signals, respectively. A plurality of first resistors each providing input resistance each have one end thereof connected to a corresponding one of the input terminals, and another end thereof connected to corresponding ends of the other first resistors. A first amplifier has a positive input terminal to which the another end of each of the first resistors is commonly connected. A second resistor has one end connected to the output terminal of the first amplifier, and another end connected to the negative input terminal of the first amplifier. A second amplifier has a negative input terminal to which the another end of the second resistor is connected, with a positive input terminal thereof grounded. A plurality of third resistors are connected in series between the negative input terminal of the second amplifier and the positive input terminal of the first amplifier. The third resistors have nodes located between adjacent ones thereof, and a plurality of switches are connected between the respective nodes of the third resistors and the output terminal of the second amplifier. The input signals are mixed by the mixer circuit, and an output signal of the mixer circuit is generated from the output terminal of the first amplifier.

2 Claims, 4 Drawing Sheets

MIXER CIRCUIT

BACKGROUND OF THE INVENTION

1. Field of the Invention

The present invention relates to a mixer circuit which is adapted to mix a plurality of signals at a high S/N (signal-to-noise ratio).

2. Prior Art

Examples of known mixer circuits will be explained referring to the drawings. FIG. 1 is a circuit diagram showing the configuration of one example of known mixer circuit. In FIG. 1, an operational amplifier (op-amp) OP1 has a positive input terminal which is grounded, and a negative input terminal to which input resistors 11–15 are connected in parallel. Feedback resistors 21–26 are connected in series between the output terminal and negative input terminal of the operational amplifier OP1. Also, nodes or junction points between adjacent feedback resistors 21–26 are connected to the output terminal of the operational amplifier OP1 via respective switches SW1–SW5. The input resistors 11–15 have respective resistance values R1–R5, and the feedback resistors 21–26 have respective resistance values R6–R11.

In the mixer circuit constructed as above, input signals V1–V5 (the level of each input signal is measured in voltage [V]) are mixed in a proportion corresponding to that of the resistance values R1–R5, and are amplified at the same time. If switch SW3 is in the ON state while all the other switches are in the OFF states, for example, the output signal Vout (the level of which is measured in voltage [V]) is given by the following expression (1).

$$Vout=-(R6+R7+R8)\cdot(V1/R1+V2/R2+V3/R3+V4/R4+V5/R5) \quad (1)$$

When input signals V1–V5 having large amplitude levels are applied to the input terminal of the operating amplifier OP1, the output signal Vout exceeds the dynamic range of the amplifier OP1, and clipping may occur in the output waveform. The switches SW1–SW5 are provided for preventing waveform distortion due to such clipping. In the case where clipping of the output waveform occurs as described above, the switch SW2 is placed in the ON state, and all the other switches are placed in the OFF states. In this case, the output signal Vout is given by the following expression (2).

$$Vout=-(R630\ R7)\ (V1/R1+V2/R2+V3/R3+V4/R4+V5/R5) \quad (2)$$

Thus, the level of the output signal Vout obtained when only the switch SW2 is ON is (R6+R7)/(R6+R7+R8) times as high as that of the output signal Vout obtained when only the switch SW3 is ON. In this manner, clipping of the output waveform can be prevented by suitably switching the operating states of the switches SW1–SW5.

In the meantime, the output signal Vout of the mixer circuit is often supplied to a circuit (not shown) in the next stage via wiring, and subjected to various types of processing. In this case, it is desirable in view of the S/N of the whole circuit system that the output signal Vout of the mixer circuit be at the maximum level with no waveform distortion. In some cases, the gain of the mixer circuit is desired to be slightly or minutely changed according to a change in the gain of the circuit in the next stage. To this end, the feedback resistance of the mixer circuit needs to be changed in multiple steps. In this known example, the selection of the gain is made in only six steps, namely, the gain is selected from only six values, by placing a selected one of the switches SW1–SW5 in the ON-state, or placing all of the switches in the OFF state. For example, the same gain is obtained when the switches SW1 and SW5 are in the ON state and the other switches are in the OFF states, and when only the switch SW1 is in the ON state. In order to allow finer or subtler adjustment of the gain, therefore, an increased number of feedback resistors and switches need to be installed on the circuit, resulting in an undesirably increased size of the circuit.

A mixer circuit shown in FIG. 2 is an improvement of the mixer circuit of FIG. 1 in terms of the above-described problem. This mixer circuit is comprised of a mixer portion A and an amplifier portion B. The output signal Va of the mixer portion A is given by the following expression (3).

$$Va=-R6\cdot(V1/R1+V2/R2+V3/R3+V4/R4+V5/R5) \quad (3)$$

When only the switch SW2 is placed in the ON state, the output signal Vout of the amplifier portion B is given by the following expression (4).

$$Vout=Va\cdot(R9+R10+R11+R12)/(R7+R8) \quad (4)$$

When the switch SW2 and the switch SW4 are placed in the ON states, and the other switches are placed in the OFF states, the output signal Vout of the amplifier portion B is given by the following expression (5).

$$Vout=(R11+R12)/(R7+R8) \quad (5)$$

In this manner, the gain of the mixer circuit can be changed. In this example, the selection of the gain is made in fifteen different steps, namely, the gain is selected from fifteen values, by placing only one of the switches SW1–SW5 in the ON state, or placing two of the switches SW1–SW5 in the ON state at the same time. Thus, the gain of this mixer circuit can be more finely adjusted as compared with that of the mixer circuit shown in FIG. 1.

In the known mixer circuit shown in FIG. 2, the gain of the mixing portion A is fixed. If the gain of 1the mixer portion A is set to a large value assuming that the amplitude levels of the input signals V1–V5 are small, its output signal Va exceeds the dynamic range of the mixer portion A when large amplitude levels of input signals V1–V5 are applied to this portion A. In this case, the waveform of the output signal Va is clipped. If the gain of the mixer portion A is set to a small value assuming that the amplitude levels of the input signals V1–V5 are large, on the other hand, the amplitude level of the output signal Va becomes small when small amplitude levels of input signal V1–V5 are applied to the mixer portion A. In this case, if noise is introduced between the output of the mixer portion A and the negative input terminal of the operational amplifier OP2, the S/N is deteriorated or reduced due to a small signal component (low level of the output signal Va). Thus, in the known mixer circuit, the waveform distortion and the S/N, which have a trade-off relationship, cannot be both improved at the same time.

SUMMARY OF THE INVENTION

It is therefore an object of the present invention to provide a mixer circuit which is capable of mixing a plurality of input signals at a high S/N (signal-to-noise ratio), without causing waveform distortion of its output signal.

To attain the above object, the present invention provides a mixing circuit for mixing a plurality of input signals, comprising a plurality of input terminals that receive the plurality of input signals, respectively, a plurality of first resistors each providing input resistance, each of the first resistors having one end thereof connected to a corresponding one of the plurality of input terminals, and another end thereof connected to corresponding ends of the other first resistors, a first amplifier having a positive input terminal, a negative input terminal and an output terminal, the another end of each of the first resistors being commonly connected to the positive input terminal of the first amplifier, a second resistor having one end thereof connected to the output terminal of the first amplifier, and another end thereof connected to the negative input terminal of the first amplifier, a second amplifier having a positive input terminal, a negative input terminal and an output terminal, the another end of the second resistor being connected to the negative input terminal of the second amplifier, the positive input terminal of the second amplifier being grounded, a plurality of third resistors that are connected in series between the negative input terminal of the second amplifier and the positive input terminal of the first amplifier, the plurality of third resistors having nodes located between adjacent ones thereof, and a plurality of switches respectively connected between respective ones of the nodes of the third resistors and the output terminal of the second amplifier, wherein the plurality of input signals are mixed by the mixer circuit, and an output signal of the mixer circuit is generated from the output terminal of the first amplifier.

Preferably, each of the first amplifier and the second amplifier is an operational amplifier.

The above and other objects, features, and advantages of this invention will become more apparent from the following detailed description taken in conjunction with the accompanying drawings.

DETAILED DESCRIPTION

The invention will now be described in detail with reference to the drawings showing an embodiment thereof.

Figure 1:
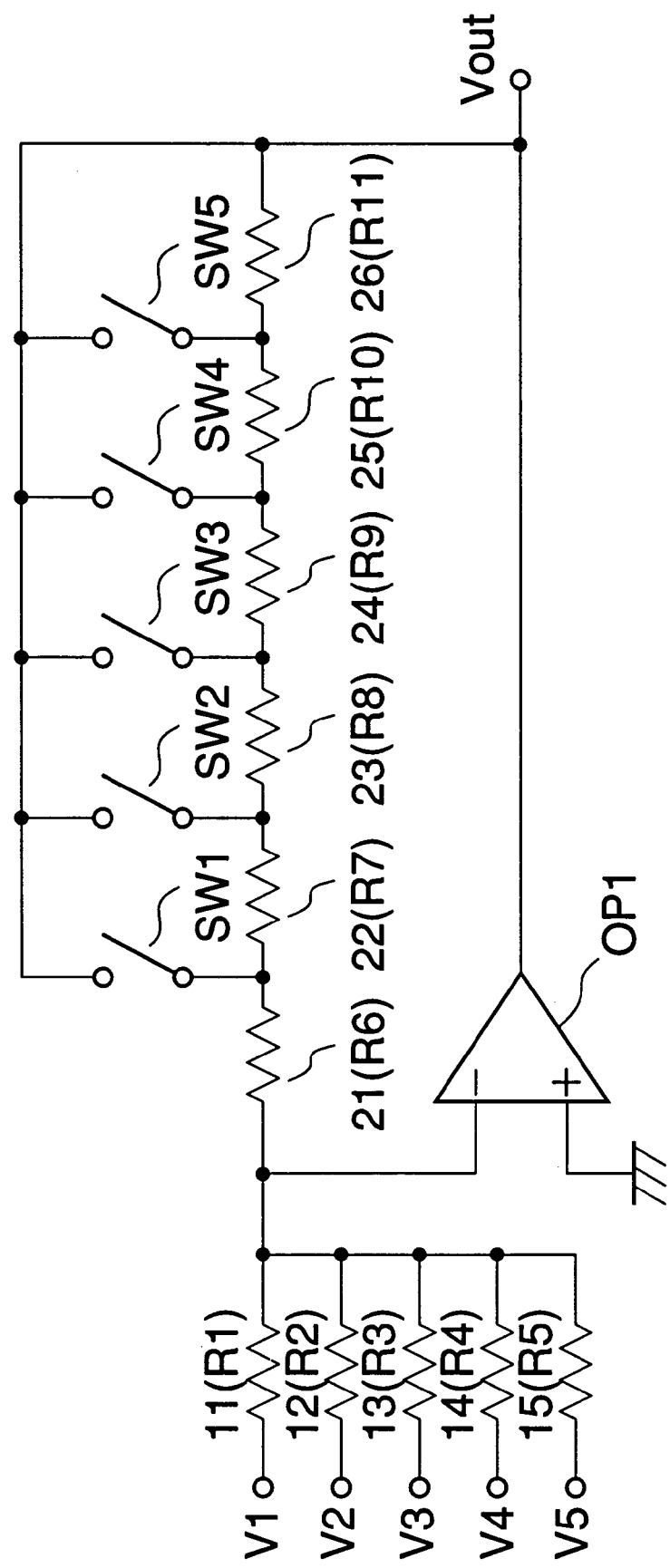
FIG. 1 is a circuit diagram showing the configuration of one example of known mixer circuit.
Figure 2:
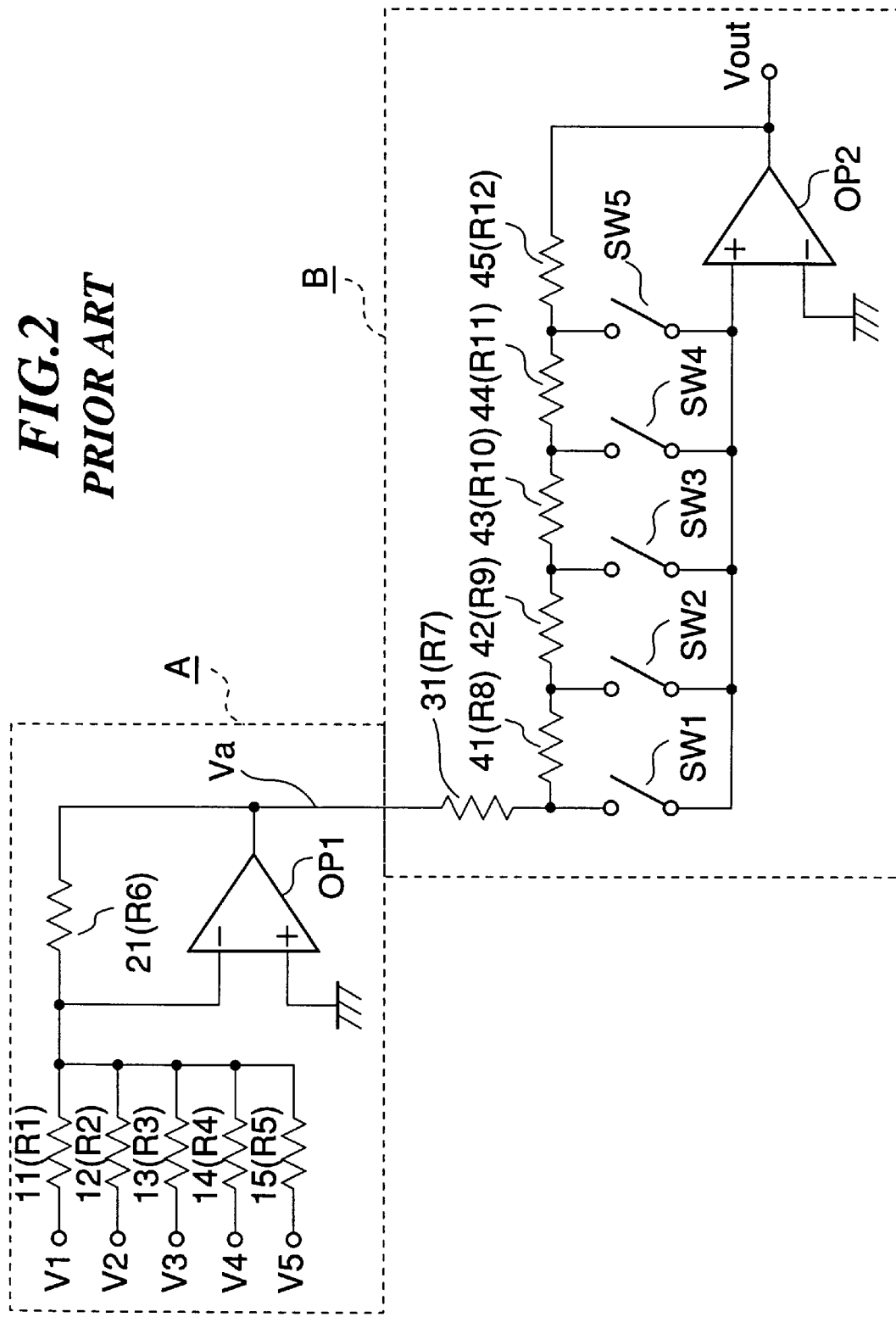
FIG. 2 is a circuit diagram showing the configuration of another example of known mixer circuit.
Figure 3:
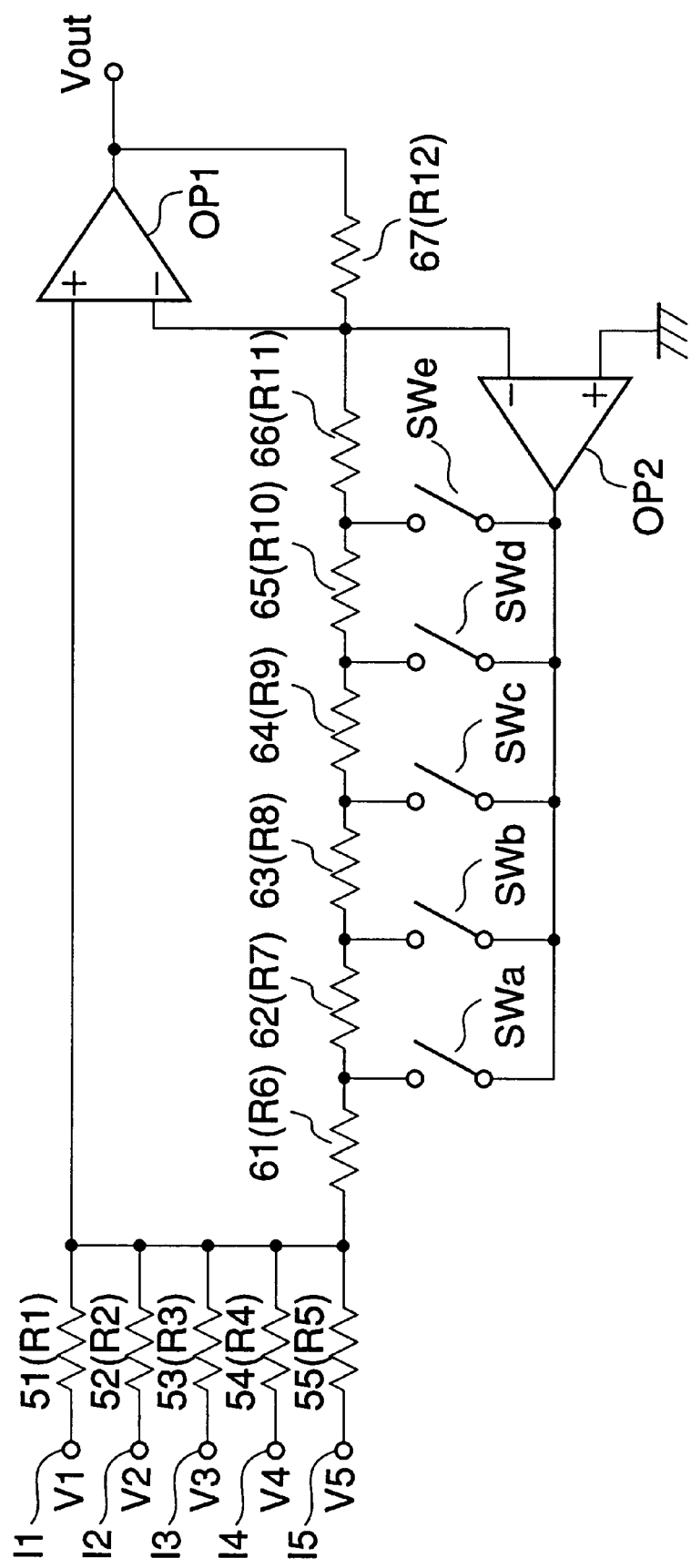
FIG. 3 is a circuit diagram showing the configuration of a mixer circuit according to one embodiment of the present invention.

FIG. 3 is a circuit diagram of one embodiment of the mixer circuit of the invention. In FIG. 3, input resistors 51–55 are connected in parallel to the positive input terminal of an operational amplifier OP1, and input signals V1–V5 are supplied to this amplifier OP1 via respective input terminals 11–15 each provided at one end of a corresponding one of the input resistors 51–55. The output of the operational amplifier OP1 is connected to its negative input terminal via a resistor 67. The mixer circuit also includes an operational amplifier OP2 having a negative input terminal thereof connected to a node or junction point between the negative input terminal of the operational amplifier OP1 and the resistor 67. In this arrangement, the resistor 67 provides feedback resistance for the operational amplifier OP1, and also provides input resistance for the operational amplifier OP2.

In the mixer circuit of FIG. 3, resistors 61–66 are connected in series between the negative input terminal and positive input terminal of the operational amplifier OP1, and nodes between adjacent resistors 61–66 are connected to the output terminal of the operational amplifier OP2 via respective switches SWa–SWe. The positive input terminal of the operational amplifier OP2 is grounded. In this arrangement, the resistors 62–66 provide feedback resistance for the operational amplifier OP2. The resistors 51–55 have respective resistance values R1–R5, and the resistors 61–67 have respective resistance values R6–R12.

In the mixer circuit constructed as above, the operational amplifier OP1 operates as a normal or non-inverting amplifier, and the operational amplifier OP2 operates as an inverting amplifier. The operational amplifier OP2, resistors 61–67 and switches SWa–SWe act to invert the output of the operational amplifier OP1, adjust the gain, and add the thus adjusted gain to its input, thereby forming a feedback loop. Thus, the mixer circuit of the present embodiment can perform mixing and amplification of the input signals V1–V5 at the same time.

Figure 4:
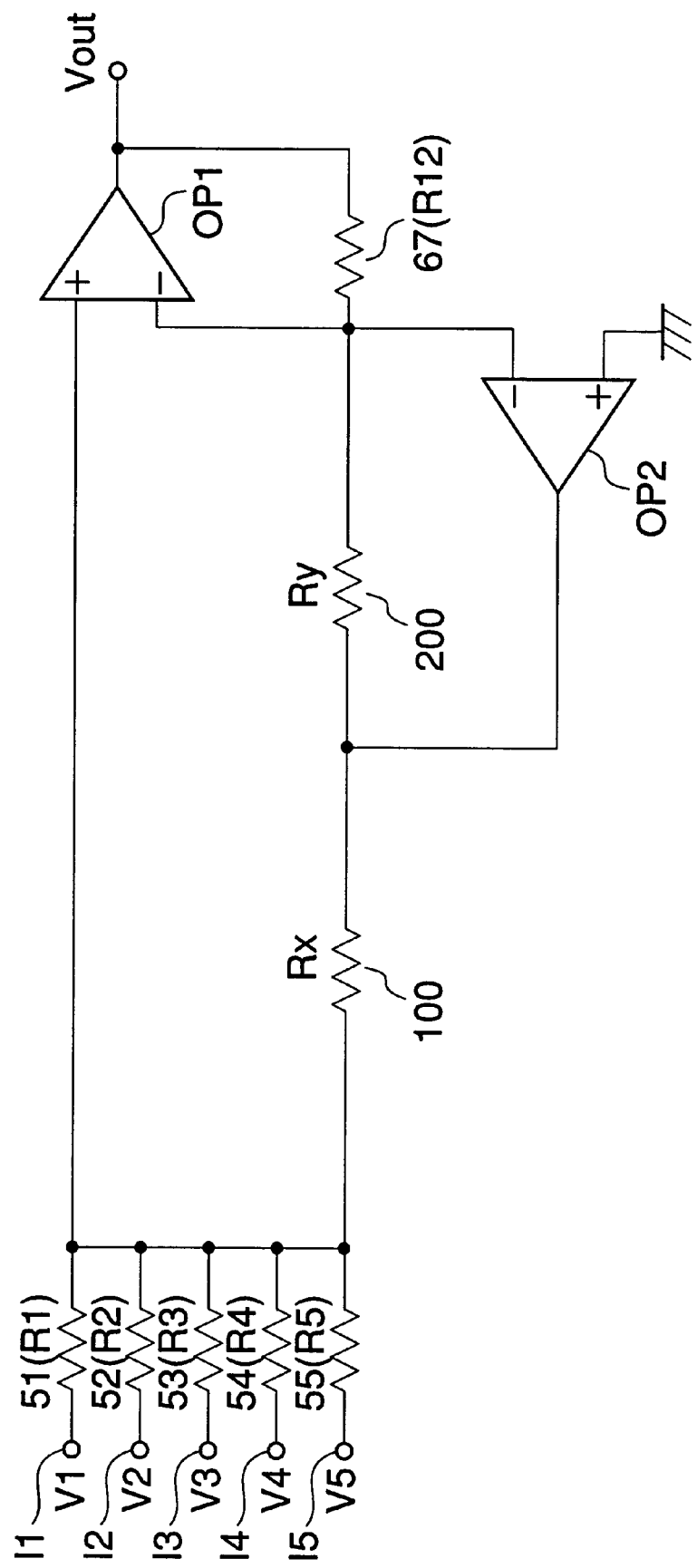
FIG. 4 is an equivalent circuit diagram of the mixer circuit of FIG. 3.

When at least one of the switches SWa–SWe is placed in the ON state, the mixer circuit of FIG. 3 can be represented by a circuit diagram of FIG. 4. In FIG. 4, reference numerals 100, 200 denote combined resistors, and their resistance values are Rx, Ry, respectively. For example, if only the switch SWd shown in FIG. 3 is placed in the ON state, the combined resistor 100 is equivalent to a combination of the resistors 61–64 connected in series, and its resistance value Rx is equal to R6+R7+R8+R9. The combined resistor 200 is equivalent to a combination of the resistors 65, 66 connected in series, and its resistance value Ry is equal to R10+R11.

In the above case, the output signal Vout is given by the following expression (6), using the resistance values Rx, Ry.

$$Vout = Rx \cdot (V1/R1 + V2/R2 + V3/R3 + V4/R4 + V5/R5) \cdot R12/Ry \quad (6)$$

As is apparent from the above expression (6), the mixing proportion of the input signals V1–V5 is determined by the resistance values R1–R5, and the gain of the whole circuit is determined by Rx·R12/Ry. In this connection, the resistance values Rx, Ry change depending upon the operating states of the switches SWa–SWe. The selection of the gain in this embodiment may be made in fifteen different steps, namely, the gain is selected from fifteen values, by placing only one of the switches SWa–SWe in the ON state, or placing two of the switches SWa–SWe in the ON state at the same time.

If only the switch SWb is placed in the ON state, for example, Rx=R6+R7 and Ry=R8+R9+R10+R11 hold. If the output signal Vout is clipped in this state, only the switches SWb and SWa may be placed in the ON states. In this case, Rx=R6 and Ry=R8+R9+R10+R11 hold. Namely, the level of the output signal Vout is R6 (R9+R10+R11)/{(R6+R7)(R8+R9+R10+R11)} times as high as that of the output signal obtained when only the switch SWb is placed in the ON state. Thus, the gain of the whole circuit can be finely adjusted by controlling each of the switches SWa–SWe.

When the input signal V1–V5 have large amplitude levels, therefore, the gain of the whole circuit can be suitably adjusted so as to avoid clipping of the output signal Vout. When the input signals V1–V5 have small amplitude levels, on the other hand, the level of the output signal Vout can be increased so that the S/N (signal-to-noise ratio) will not be reduced.

In the present embodiment described above, the selection of the gain can be made in fifteen different steps by selectively operating the switches SWa–SWe, and therefore the gain can be finely or subtly adjusted with a simple arrangement. Also, even if the amplitude levels of the input signals V1–V5 vary to a large extent, the input signals V1–V5 can be mixed at a high S/N without causing waveform distortion.

What is claimed is:

1. A mixing circuit for mixing a plurality of input signals, comprising:

a plurality of input terminals that receive said plurality of input signals, respectively;

a plurality of first resistors each providing input resistance, each of said first resistors having one end thereof connected to a corresponding one of said plurality of input terminals, and another end thereof connected to corresponding ends of the other first resistors;

a first amplifier having a positive input terminal, a negative input terminal and an output terminal, the another end of each of said first resistors being commonly connected to the positive input terminal of the first amplifier;

a second resistor having one end thereof connected to said output terminal of said first amplifier, and another end thereof connected to said negative input terminal of the first amplifier;

a second amplifier having a positive input terminal, a negative input terminal and an output terminal, the another end of said second resistor being connected to said negative input terminal of the second amplifier, said positive input terminal of the second amplifier being grounded;

a plurality of third resistors that are connected in series between said negative input terminal of said second amplifier and said positive input terminal of said first amplifier, said plurality of third resistors having nodes located between adjacent ones thereof; and a plurality of switches connected between respective ones of said nodes of said third resistors and said output terminal of said second amplifier, wherein said plurality of input signals are mixed by said mixer circuit, and an output signal of the mixer circuit is generated from said output terminal of said first amplifier.

2. A mixer circuit as claimed in claim 1, wherein each of said first amplifier and said second amplifier is an operational amplifier.

* * * * *